US011204383B2

(12) United States Patent
Frankel

(10) Patent No.: US 11,204,383 B2
(45) Date of Patent: Dec. 21, 2021

(54) METHODS FOR MAINTAINING GAP SPACING BETWEEN AN OPTICAL PROBE OF A PROBE SYSTEM AND AN OPTICAL DEVICE OF A DEVICE UNDER TEST, AND PROBE SYSTEMS THAT PERFORM THE METHODS

(71) Applicant: FormFactor, Inc., Livermore, CA (US)

(72) Inventor: Joseph George Frankel, Beaverton, OR (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 16/914,913

(22) Filed: Jun. 29, 2020

(65) Prior Publication Data

US 2021/0096175 A1 Apr. 1, 2021

Related U.S. Application Data

(60) Provisional application No. 62/939,399, filed on Nov. 22, 2019, provisional application No. 62/908,423, filed on Sep. 30, 2019, provisional application No. 62/908,403, filed on Sep. 30, 2019, provisional application No. 62/908,440, filed on Sep. 30, 2019.

(51) Int. Cl.
*G01R 31/28* (2006.01)
*G01R 1/067* (2006.01)

(52) U.S. Cl.
CPC ..... *G01R 31/2889* (2013.01); *G01R 1/06794* (2013.01); *G01R 31/2891* (2013.01)

(58) Field of Classification Search
CPC ............... G01R 1/06794; G01R 31/28; G01R 31/2831; G01R 31/2884; G01R 31/2886; G01R 31/2889; G01R 31/2891; G01R 31/311; G01R 1/07314; G01R 1/07342
See application file for complete search history.

(56) References Cited

U.S. PATENT DOCUMENTS

| 7,043,848 B2 | 5/2006 | Hollman et al. |
| 7,348,786 B2 | 3/2008 | Thacker et al. |
| 7,397,257 B2 | 7/2008 | Kobayashi et al. |
| 9,804,196 B2 | 10/2017 | Bolt et al. |
| 2017/0115206 A1 | 4/2017 | De Boer et al. |

(Continued)

*Primary Examiner* — Jermele M Hollington
*Assistant Examiner* — Suresh K Rajaputra
(74) *Attorney, Agent, or Firm* — Dascenzo Gates Intellectual Property Law, P.C.

(57) ABSTRACT

Methods for maintaining gap spacing between an optical probe of a probe system and an optical device of a device under test and probe systems that perform the methods. The methods include determining a desired relative orientation between the optical probe and the DUT and optically testing the optical device with the optical probe. The methods also include maintaining the desired relative orientation during the optically testing. The maintaining includes repeatedly and sequentially collecting an existing DUT image of a DUT reference structure of the DUT and an existing probe image of a probe reference structure of the optical probe, determining a probe-DUT offset between an existing relative orientation between the optical probe and the DUT and the desired relative orientation, and adjusting the relative orientation to return the optical probe and the DUT to the desired relative orientation.

20 Claims, 4 Drawing Sheets

(56) References Cited

U.S. PATENT DOCUMENTS

| | | | |
|---|---|---|---|
| 2017/0146594 A1* | 5/2017 | Andrews | G01R 31/2891 |
| 2019/0227102 A1 | 7/2019 | Frankel et al. | |
| 2020/0217638 A1 | 7/2020 | Negishi et al. | |
| 2021/0096176 A1* | 4/2021 | Frankel | G01R 31/2889 |

* cited by examiner

METHODS FOR MAINTAINING GAP SPACING BETWEEN AN OPTICAL PROBE OF A PROBE SYSTEM AND AN OPTICAL DEVICE OF A DEVICE UNDER TEST, AND PROBE SYSTEMS THAT PERFORM THE METHODS

RELATED APPLICATIONS

This application claims priority to U.S. Provisional Patent Application Nos. 62/908,403, 62/908,423, and 62/908,440, which were filed on Sep. 30, 2019, and also claims priority to U.S. Provisional Patent Application No. 62/939,399, which was filed on Nov. 22, 2019, and the complete disclosures of which are hereby incorporated by reference.

FIELD OF THE DISCLOSURE

The present disclosure relates generally to methods for maintaining gap spacing between an optical probe of a probe system and an optical device of a device under test and/or to probe systems that perform the methods.

BACKGROUND OF THE DISCLOSURE

Probe systems may be utilized to probe and/or to test the operation of a device under test (DUT). In the electronics industry, probe systems historically have taken the form of electrical probe systems that provide a probe electric current to the DUT and/or that receive a corresponding resultant electric current from the DUT. More recently, optical probe systems have been developed to probe optical DUTs that include optical components. In state-of-the art optical DUTs, optical devices may be defined within planes that may be parallel to a substrate surface of the substrate and/or may be configured to propagate optical signals within these planes. In such state-of-the-art optical DUTs, these optical devices may be defined below the substrate surface, and access to these optical devices may be provided via a side wall of a trench and/or via a die edge that extends vertically. In such systems, it may be desirable to control and/or regulate a gap spacing between an optical probe and the optical devices to an accuracy that is far greater than that needed to maintain electrical contact between an electrical probe of an electrical probe system and a corresponding electrical contact pad of a DUT. Thus, there exists a need for improved methods for maintaining gap spacing between an optical probe of a probe system and an optical device of a device under test and/or for improved probe systems that perform the methods.

SUMMARY OF THE DISCLOSURE

Methods for maintaining gap spacing between an optical probe of a probe system and an optical device of a device under test and probe systems that perform the methods. The methods include determining a desired relative orientation between the optical probe and the DUT. The desired relative orientation defines a desired gap spacing between the optical probe and the optical device. The methods also include optically testing the optical device with the optical probe.

The methods further include maintaining the desired relative orientation during the optically testing. The maintaining includes repeatedly and sequentially collecting an existing DUT image of a DUT reference structure of the DUT and an existing probe image of a probe reference structure of the optical probe, determining a probe-DUT offset between an existing relative orientation between the optical probe and the DUT and the desired relative orientation, and adjusting the relative orientation to return the optical probe and the DUT to the desired relative orientation. The collecting includes collecting with an optical imaging device of the probe system. The determining the probe-DUT offset is based, at least in part, on the desired relative orientation, the existing DUT image, and the existing probe image. The adjusting is based, at least in part, on the probe-DUT offset.

DETAILED DESCRIPTION AND BEST MODE OF THE DISCLOSURE

Figure 1:
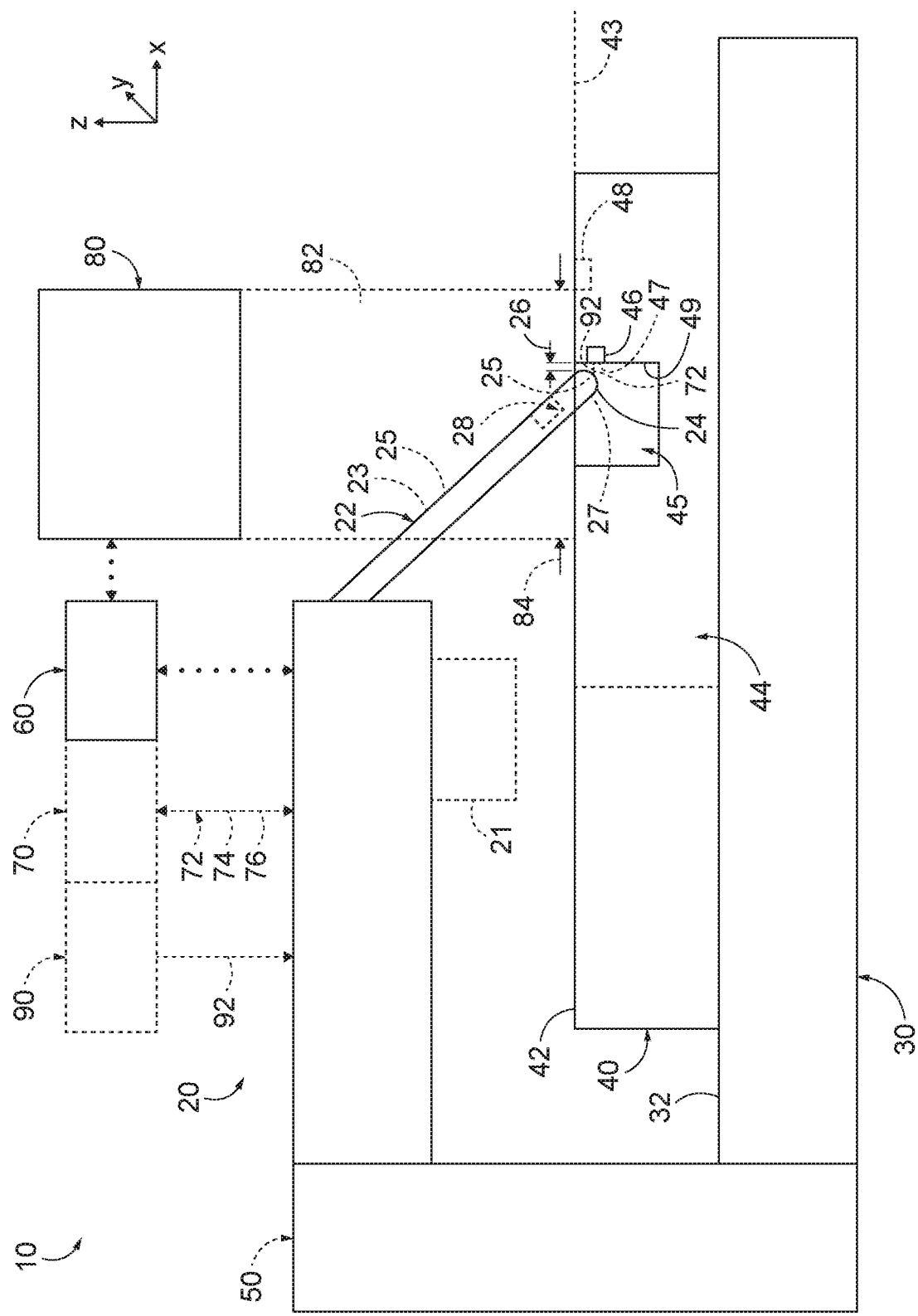
FIG. 1 is a schematic illustration of examples of probe systems that may perform methods according to the present disclosure.

FIGS. 1-4 provide examples of probe systems 10 and/or of methods 200, according to the present disclosure. Elements that serve a similar, or at least substantially similar, purpose are labeled with like numbers in each of FIGS. 1-4, and these elements may not be discussed in detail herein with reference to each of FIGS. 1-4. Similarly, all elements may not be labeled in each of FIGS. 1-4, but reference numerals associated therewith may be utilized herein for consistency. Elements, components, and/or features that are discussed herein with reference to one or more of FIGS. 1-4 may be included in and/or utilized with any of FIGS. 1-4 without departing from the scope of the present disclosure. In general, elements that are likely to be included in a particular embodiment are illustrated in solid lines, while elements that are optional are illustrated in dashed lines. However, elements that are shown in solid lines may not be essential and, in some embodiments, may be omitted without departing from the scope of the present disclosure.

Figure 2:
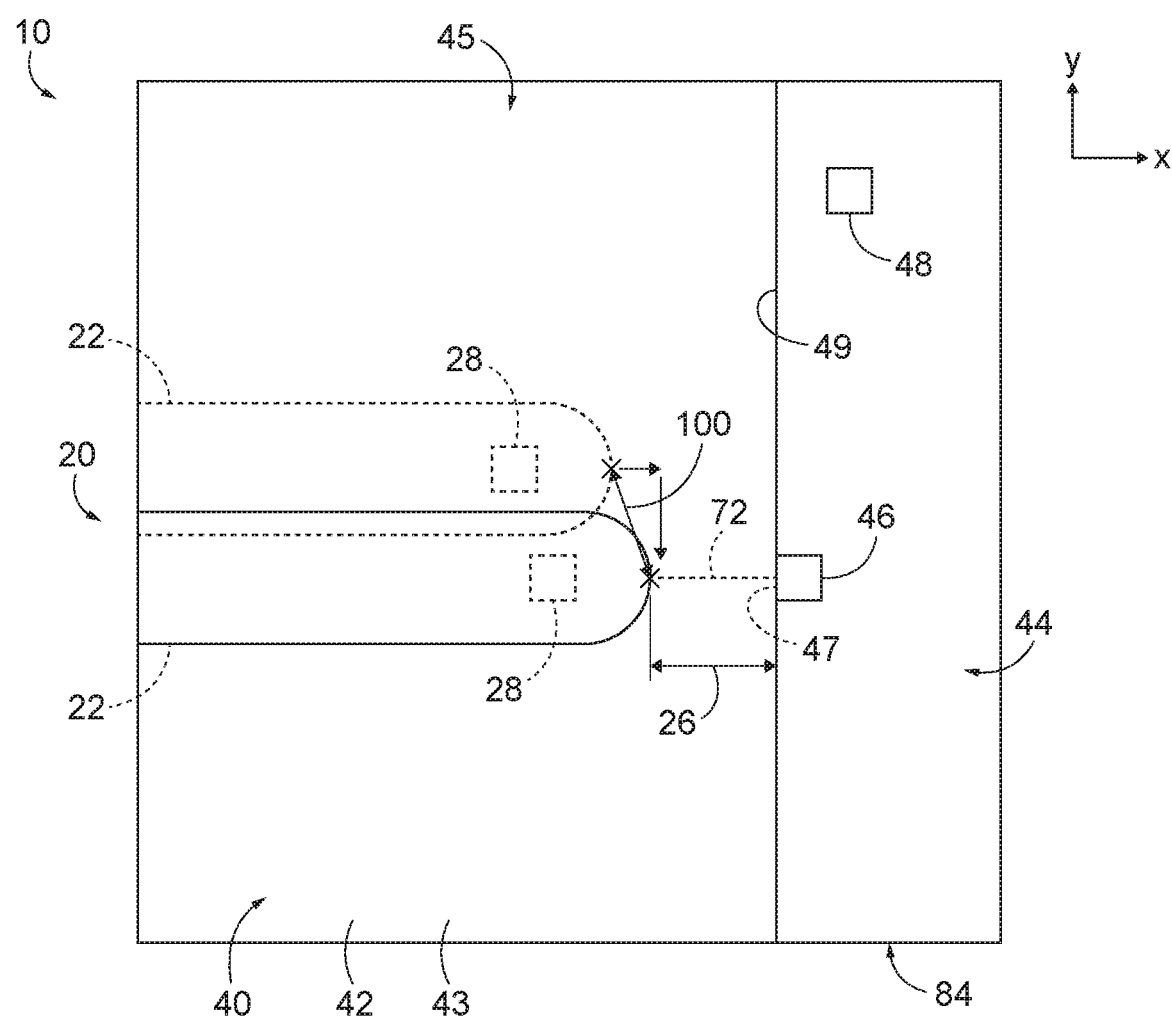
FIG. 2 is a schematic top view illustrating examples of probe systems performing methods according to the present disclosure.
Figure 3:
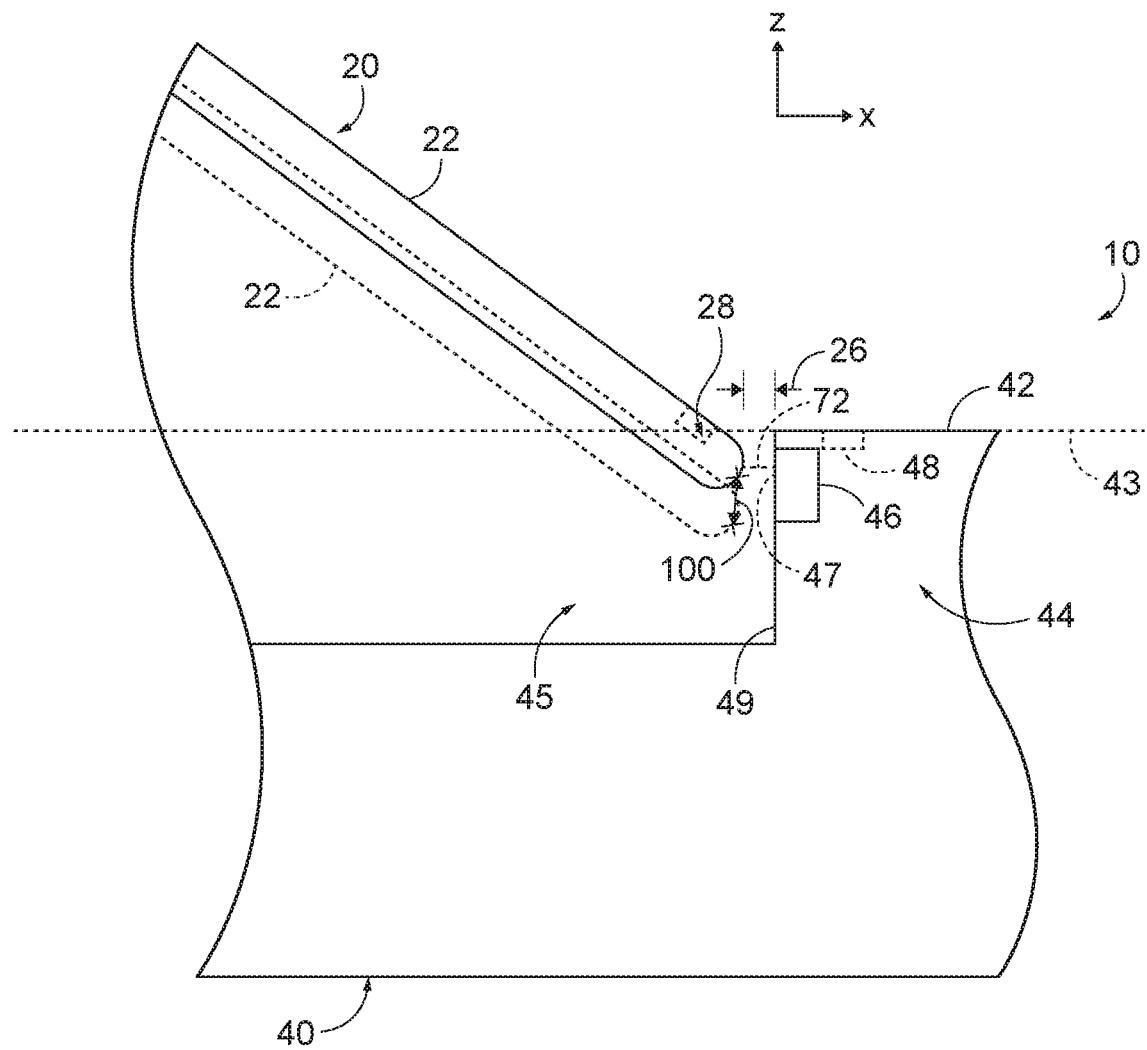
FIG. 3 is a schematic side view illustrating examples of probe systems performing methods according to the present disclosure.

FIG. 1 is a schematic illustration of examples of probe systems 10 that may perform methods 200, according to the present disclosure. FIG. 2 is a schematic top view illustrating examples of probe systems 10 performing methods 200, and FIG. 3 is a schematic side view illustrating examples of probe systems 10 performing methods 200.

As illustrated in FIG. 1, probe systems 10 include a probing assembly 20. Probing assembly 20 may include an optical probe 22 that may define a probe tip 24. Probe systems 10 also include a support surface 32 that may be configured to support a substrate 40. Substrate 40 may include a device under test (DUT) 44 that may include an optical device 46.

Probe systems 10 also include an electrically actuated positioning assembly 50. Electrically actuated positioning assembly 50 may be configured to selectively adjust a relative orientation between probing assembly 20, or optical probe 22 thereof, and substrate 40, or DUT 44 thereof. Probe systems 10 further include an optical imaging device 80 and a controller 60. Controller 60 may be adapted, configured, and/or programmed to control the operation of at least one component of probe system 10.

During operation of probe systems 10, and as discussed in more detail herein, optical probe 22 may be aligned and/or positioned with respect to optical device 46 such that a gap 26 extends therebetween. Gap 26 also may be referred to herein as, and/or may be, an air gap 26 between the optical probe and the optical device. This may include aligning and/or positioning the optical probe proximate a vertical surface 49 of DUT 44, such as within a trench that is defined within the DUT and/or along an edge of the DUT.

Then, optical imaging device 80 may be utilized to observe optical probe 22 and DUT 44 while the optical probe is utilized to optically test optical device 46 of the DUT. During this testing and observation, controller 60 may receive optical images from optical imaging device 80 and may utilize these optical images to determine and/or to quantify changes in relative orientation between the optical probe and the DUT. The controller then may direct electrically actuated positioning assembly 50 to adjust the relative orientation between the optical probe and the DUT. This may include adjusting to maintain a fixed, or an at least substantially fixed, relative orientation between the optical probe and the DUT, to maintain the relative orientation between the optical probe and the DUT at, or near, a desired relative orientation between the optical probe and the DUT, to maintain a fixed, or an at least substantially fixed, magnitude of gap 26, and/or to maintain gap 26 at, or near, a desired gap between the optical probe and the optical device. As a more specific example, the controller may direct the electrically actuated positioning assembly to maintain the relative orientation to within a threshold orientation change, examples of which are disclosed herein. The desired relative orientation also may be referred to herein as a target relative orientation. The desired gap also may be referred to herein as a target gap and/or as an initial gap.

As discussed in more detail herein, optical probe 22 may include a lens 27, which may have and/or define a focal length. In addition, optical device 46 may include a waveguide entrance 47. In such a configuration, the desired relative orientation and/or the desired gap may be based, at least in part, on the focal length of the optical probe and/or on the position of the waveguide entrance of the optical device. As an example, the desired relative orientation and/or the desired gap may include a relative orientation and/or gap that positions the optical probe and the optical device, relative to one another, such that gap 26 is based upon, is equal to, and/or is at least substantially equal to the focal length.

As an example, and as illustrated in FIG. 2, optical probe 22 may drift, or may spatially drift, within a plane 43 that is parallel to a substrate surface 42 of substrate 40. This drift may be away from the desired relative orientation with respect to optical device 46, which is illustrated in solid lines, to an existing relative orientation with respect to optical device 46, which is illustrated in dashed lines. In such a configuration, controller 60 may control electrically actuated positioning assembly 50 to return the probe to the desired relative orientation with respect to the optical device. This may be accomplished, for example, by calculating a probe-DUT offset 100 between the existing relative orientation and the desired relative orientation, as obtained via optical observation via optical imaging device 80, and adjusting the relative orientation based, at least in part, on the probe-DUT offset.

In the example of FIG. 2, the probe-DUT offset is illustrated as extending in only two dimensions, e.g., the X and Y dimensions and/or plane 43 of FIG. 2. In some examples, controller 60 only may adjust the relative orientation, or only may utilize the optical observation to adjust the relative orientation, in the two dimensions. Additionally or alternatively, and in some examples, controller 60 also may adjust the relative orientation in a third dimension. This is illustrated in FIG. 3. Similar to the example of FIG. 2, FIG. 3 illustrates drift of optical probe 22 from the desired relative orientation with respect to optical device 46, which is illustrated in solid lines, to the existing relative orientation with respect to the optical device, which is illustrated in dashed lines. In such a configuration, controller 60 also may be configured to determine and/or quantify drift in the third dimension (e.g., the Z-dimension of FIG. 3) and to control electrically actuated positioning assembly 50 to return the probe to the desired relative orientation with respect to the optical device.

Quantification of drift in the third dimension (e.g., the Z-dimension of FIG. 3) may be accomplished in any suitable manner. As an example, controller 60 may be programmed to adjust a focus of optical imaging device 80 to determine and/or to quantify drift in the Z-dimension. As another example, controller 60 may be programmed to utilize a distance sensor 21, as illustrated in FIG. 1, to determine and/or to quantify drift in the Z-dimension. Examples of distance sensor 21 include a capacitive distance sensor, an optical distance sensor, and/or an interferometer. Distance sensor 21 may be adapted, configured, designed, and/or constructed to quantify the drift in the third dimension to within a threshold drift resolution. Examples of the threshold drift resolution include resolutions of at least 0.01 micrometers, at least 0.1 micrometers, at least 0.25 micrometers, at least 0.5 micrometers, at most 5 micrometers, at most 2.5 micrometers, at most 1 micrometer, and/or at most 0.5 micrometers. Additional examples of distance sensor 21 are disclosed in U.S. patent application Ser. No. 16/730,584, which was filed on Dec. 30, 2019, and the complete disclosure of which is hereby incorporated by reference.

Probing assembly 20 may include any suitable structure that may include optical probe 22. As an example, probing assembly 20 and/or optical probe 22 thereof may include and/or be a lensed optical fiber 23 that includes lens 27 that may be at, may be proximate, and/or may define probe tip 24, as illustrated in FIG. 1. As another example, optical probe 22 may include and/or be a faceted optical fiber 25. Optical probe 22 may be configured to convey a probe light beam 72, examples of which are disclosed herein.

Probing assembly 20 and/or optical probe 22 thereof may include a probe reference structure 28. Probe reference structure 28 may be adapted, configured, sized, designed, shaped, and/or constructed to improve an accuracy with which imaging device 80 may spatially locate optical probe 22, as discussed in more detail herein. Examples of probe reference structure 28 include a fiducial, a fiducial mark, and/or a fiducial target, which may be formed on, defined by, and/or operatively attached to optical probe 22. Probe reference structure 28, when present, may be adapted, configured, sized, positioned, and/or constructed to improve an accuracy within which optical imaging device 80 may locate, or determine a position of, optical probe 22, such as in the X, Y, and/or Z directions of FIG. 1. Additional examples of probe reference structures 28, in the form of fiducial marks and/or fiducial targets, are disclosed in U.S. Pat. No. 9,804,196, which issued on Oct. 31, 2017, and U.S. Patent Application Publication No. 2019/0227102, which was filed on Jan. 16, 2019, and the complete disclosures of which are hereby incorporated by reference.

Similarly, substrate 40 and/or DUT 44 thereof may include a DUT reference structure 48. DUT reference structure 48 may include any suitable structure on substrate 40 that may be visible to imaging device 80 and/or that may be adapted, configured, sized, designed, shaped, positioned, and/or constructed to improve an accuracy with which imaging device 80 may spatially locate substrate 40, DUT 44, and/or optical device 46 relative to optical probe 22. Examples of DUT reference structure 48 are disclosed herein.

In some examples, and as illustrated in dashed lines in FIG. 1, probing assembly 20 also may include distance sensor 21. Distance sensor 21 may be configured to measure, to calculate, and/or to determine a distance between at least a region of the probing assembly and a corresponding region of substrate surface 42 of substrate 40. Examples of distance sensor 21 are disclosed herein.

Support surface 32 may include any suitable surface that may be adapted, configured, designed, sized, and/or constructed to support, or to operatively support substrate 40. As an example, and as illustrated in FIG. 1, probe system 10 may include a chuck 30, which also may be referred to herein as a wafer chuck 30, that may form and/or define support surface 32.

Electrically actuated positioning assembly 50 may include any suitable structure that may be adapted, configured, designed, and/or constructed to selectively adjust the relative orientation between optical probe 22 and DUT 44. This may include selective and/or operative adjustment of the absolute position of the optical probe relative to the DUT and/or of the DUT relative to the optical probe. Examples of electrically actuated positioning assembly 50 include a piezoelectric positioning assembly, a motorized positioning assembly, and/or a stepper motor.

Optical imaging device 80 may include any suitable structure that may be adapted, configured, designed, and/or constructed to observe optical probe 22 and/or DUT 44, to collect optical images of optical probe 22 and/or DUT 44, and/or to convey the optical images, or data representative of the optical images, to controller 60. As examples, optical imaging device 80 may include a microscope, an optical microscope, a camera, a video camera, and/or a digital camera.

As illustrated in dashed lines in FIG. 1, optical imaging device 80 may be configured to collect the optical images from above substrate 40 and/or along an optical path 82 that may extend perpendicular, or at least substantially perpendicular, to substrate surface 42. This may include collection of the optical images within a field-of-view 84 of the optical imaging device.

Controller 60 may include and/or be any suitable structure, device, and/or devices that may be adapted, configured, designed, constructed, and/or programmed to perform one or more of the functions disclosed herein. This may include control of the operation of any suitable portion, region, and/or structure of probe system 10, such as electrically actuated positioning assembly 50, and/or control according to any suitable step and/or steps of methods 200. As examples, controller 60 may include one or more of an electronic controller, a dedicated controller, a special-purpose controller, a personal computer, a special-purpose computer, a display device, a logic device, a memory device, and/or a memory device having computer-readable storage media.

The computer-readable storage media, when present, also may be referred to herein as non-transitory computer readable storage media. This non-transitory computer readable storage media may include, define, house, and/or store computer-executable instructions, programs, and/or code; and these computer-executable instructions may direct probe system 10 and/or controller 60 thereof to perform any suitable portion, or subset, of methods 200. Examples of such non-transitory computer-readable storage media include CD-ROMs, disks, hard drives, flash memory, etc. As used herein, storage, or memory, devices and/or media having computer-executable instructions, as well as computer-implemented methods and other methods according to the present disclosure, are considered to be within the scope of subject matter deemed patentable in accordance with Section 101 of Title 35 of the United States Code.

As illustrated in dashed lines in FIG. 1, probe system 10 also may include a signal generation and analysis assembly 70. Signal generation and analysis assembly 70, when present, may be adapted, configured, designed, and/or constructed to generate an optical test signal 74 that may be provided to optical device 46 by optical probe 22 as probe light beam 72 and/or to receive an optical resultant signal 76 that may be received from optical device 46 by optical probe 22 as probe light beam 72. Signal generation and analysis assembly 70 additionally or alternatively may be configured to generate an electronic test signal, such as may be provided to DUT 44, and/or to receive an electronic resultant signal, such as may be received from DUT 44. Signal generation and analysis assembly 70 additionally or alternatively may be adapted, configured, designed, and/or constructed to analyze the operation and/or performance of DUT 44, such as may be based upon the optical test signal, the optical resultant signal, the electronic test signal, and/or the electronic resultant signal.

As also illustrated in dashed lines in FIG. 1, probe system 10 may include a visible light source 90. Visible light source 90 may be configured to provide a visible light beam 92 to optical probe 22. In some examples, and as discussed in more detail herein, visible light beam 92 may illuminate probe tip 24, which may permit and/or facilitate accurate determination of the location and/or orientation of the probe tip by optical imaging device 80. In this example, the illuminated probe tip may function as probe reference structure 28 of the probing assembly.

Figure 4:
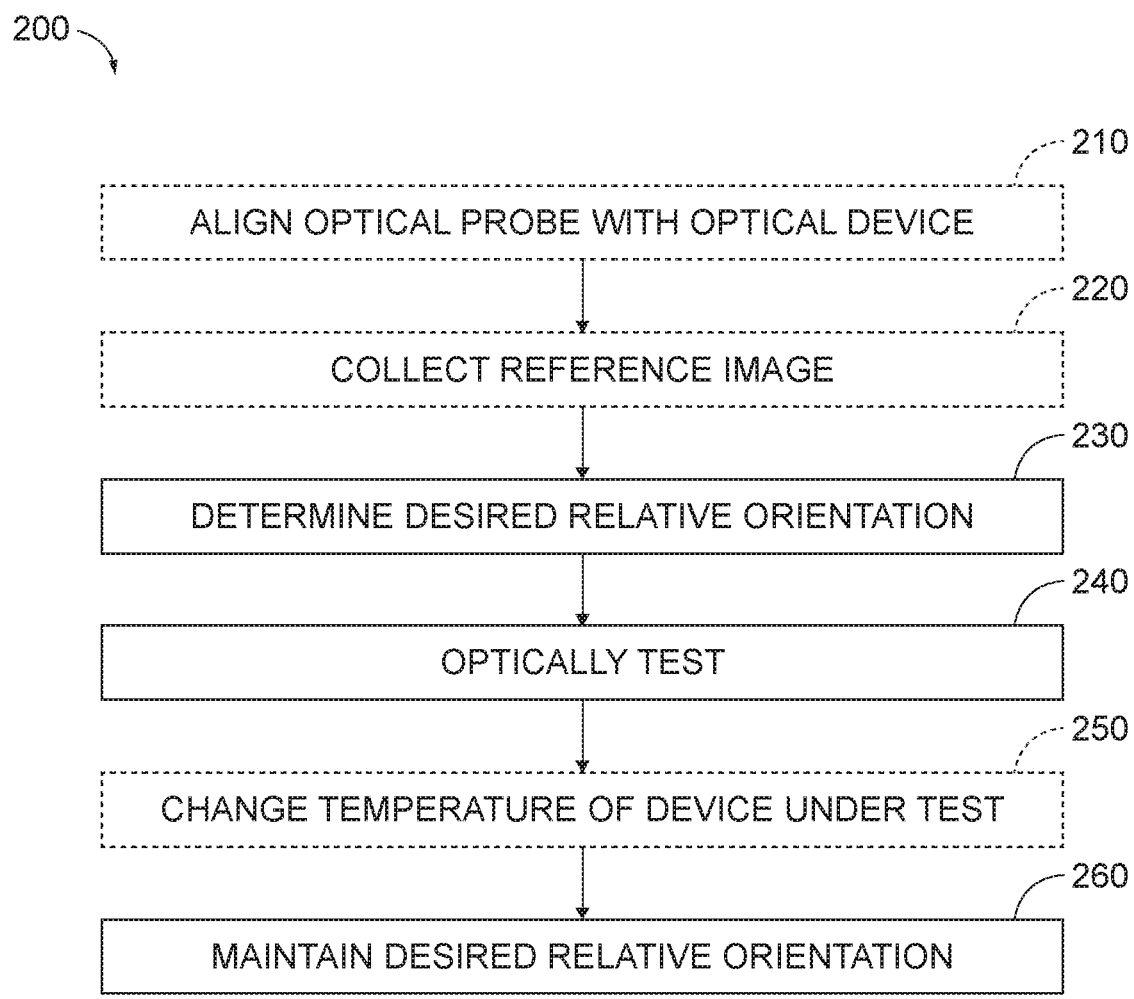
FIG. 4 is a flowchart depicting examples of methods, according to the present disclosure, of maintaining gap spacing between an optical probe of a probe system and an optical device that is positioned on a substrate.

FIG. 4 is a flowchart depicting examples of methods 200, according to the present disclosure, of maintaining gap spacing between an optical probe of a probe system, such as probe system 10 of FIG. 1, and an optical device of a device under test (DUT) that is positioned on a substrate, such as optical device 46 on substrate 40 of FIG. 1. Methods 200 may include aligning the optical probe with the optical device at 210 and/or collecting a reference image at 220. Methods 200 include determining a desired relative orientation at 230 and optically testing at 240. Methods 200 may include changing a temperature of the device under test (DUT) at 250, and methods 200 include maintaining the desired relative orientation at 260.

Aligning the optical probe with the optical device at 210, when performed, may include positioning the optical probe and the optical device, relative to one another, such that the optical probe and the optical device define a target, a desired, an initial, and/or a predetermined gap spacing therebetween. As discussed, the optical device may be positioned on and/or accessible via a vertical surface of the substrate. With this in mind, the aligning at 210 may include positioning the optical probe proximate the vertical surface of the substrate that includes and/or that provides access to the optical device. In some examples, and as discussed, the vertical surface may include, or have formed thereon, a waveguide entrance to the optical device.

The aligning at 210 may be performed with any suitable timing and/or sequence during methods 200. As examples, the aligning at 210 may be performed prior to the collecting at 220, prior to the determining at 230, prior to the optically testing at 240, and/or prior to the changing at 250.

Collecting the reference image at 220, when performed, may include collecting any suitable reference image, or reference images, with, via, and/or utilizing an optical imaging device of the probe system. The reference image may include a reference DUT image of a DUT reference structure of the DUT and/or a reference probe image of a probe reference structure of the optical probe. Examples of the DUT reference structure and of the probe reference structure are disclosed herein.

The collecting at 220 may include collecting along an optical path that extends perpendicular, or at least substantially perpendicular, to a substrate surface of the substrate. Stated another way, the collecting at 220 may include collecting from above the substrate and/or along a surface normal direction of the substrate. Additionally or alternatively, the collecting at 220 may include collecting such that the gap spacing between the optical probe and the optical device is visible within the reference DUT image and/or within the reference probe image.

In some examples, the collecting at 220 may include collecting a single reference image that includes both the reference DUT image and the reference probe image. In some such examples, both the DUT reference structure and the probe reference structure may be visible and/or in focus within the single reference image and/or within a single field of view of the optical imaging device.

In some examples, the collecting at 220 may include collecting a first reference image that includes the reference DUT image and also collecting a second reference image that includes the reference probe image. In some such examples, the optical imaging device may be focused on the DUT reference structure while collecting the first reference image and/or the field of view of the optical device may include the DUT reference structure while collecting the first reference image. Similarly, the optical imaging device may be focused on the probe reference structure while collecting the second reference image and/or the field of view of the optical device may include the probe reference structure while collecting the second reference image.

The DUT reference structure may include and/or be any suitable reference structure that may be defined by the substrate, that may be visible to the optical imaging device, that may be visible in a field of view of the optical imaging device that also includes the optical device and/or the optical probe, and/or that may permit and/or facilitate accurate and/or repeatable determination of a location of the optical device.

The DUT reference structure may have and/or define a fixed and/or a predetermined orientation, or relative orientation, with respect to the optical device and/or a waveguide entrance to the optical device. As such, the location of the optical device may be known, or even precisely known, based, at least in part, upon knowledge of a location of the DUT reference structure. As an example, a design for the DUT may specify the relative orientation between the DUT reference structure and the optical device and/or the waveguide entrance.

Examples of the DUT reference structure include a physical structure that is defined on, that is defined within, and/or that projects from the substrate and/or the substrate surface thereof. More specific examples of the DUT reference structure include a region and/or structure of the DUT, a contact pad of the DUT, a structure that is applied to the DUT, and/or a structure that is operatively attached to the DUT, such as a sphere, a microsphere, and/or a glass sphere.

In some examples, the DUT reference structure may have and/or exhibit a high contrast, or a high optical contrast, relative to a remainder of the DUT and/or relative to a substrate surface of a substrate that includes the DUT and/or upon which the DUT reference structure is positioned. In some examples, the DUT reference structure may have optically sharp and/or optically well-defined edges. Such configurations may permit and/or facilitate accurate determination of the location of the DUT reference structure utilizing the optical imagining device.

In some examples, the DUT reference structure may be symmetrical. As examples, the DUT reference structure may include at least one axis of symmetry, may include at least two axes of symmetry, and/or may be rotationally symmetric, or at least substantially rotationally symmetric, when viewed by the optical imaging device.

In some examples, and as discussed, the optical imaging device may have and/or define a field of view, such as field of view 84 of FIGS. 1-2. In some such examples, a maximum extent of the DUT reference structure, as viewed by the optical imaging device, may be less than a threshold extent fraction of the field of view of the optical imaging device. Examples of the threshold extent fraction include threshold extent fractions of at most 25%, at most 20%, at most 15%, at most 10%, at most 5%, at least 2%, at least 4%, at least 6%, at least 8%, and/or at least 10% of the field of view of the optical imaging device.

In some such examples, the DUT reference structure and the probe reference structure may be positioned, relative to one another, such that a distance between the DUT reference structure and the probe reference structure, as viewed by the optical imaging device, is less than a threshold offset fraction of the field of view of the optical imaging device. Examples of the threshold offset fraction include threshold offset fractions of at most 80%, at most 70%, at most 60%, at most 50%, at most 40%, at most 30%, at least 10%, at least 20%, at least 30%, at least 40%, and/or at least 50% of the field of view of the optical imaging device.

The probe reference structure may include any suitable structure that may be defined by the optical probe, that may be operatively attached to the optical probe, and/or that may be emitted from the optical probe. This may include any suitable probe reference structure that may be visible to the optical imaging device, that may be visible in a field of view of the optical imaging device that also includes the optical device and/or the DUT reference structure, and/or that may permit and/or facilitate accurate and/or repeatable determination of a location of the optical probe and/or of a probe tip of the optical probe with respect to the DUT reference structure and/or the optical device.

In some examples, the probe reference structure may include and/or be a shape of at least a region of the optical probe. Stated another way, the probe system may be programmed to recognize the shape of the region of the optical probe, and the probe system may utilize this shape to determine the relative orientation between the optical probe and the DUT. An example of the region of the optical probe includes a probe tip of the optical probe. Such a configuration may be relatively straightforward to implement and/or may not require utilization of additional hardware and/or components that may be present solely to facilitate the collecting at 220 and/or the determining at 230.

In some examples, methods 200 further may include directing a visible light beam through the optical probe to the probe tip of the optical probe. In these examples, the visible light beam may illuminate the probe tip and/or may generate an illuminated probe tip, and the probe reference structure may include and/or be the illuminated probe tip.

The optically testing at 240 may include optically testing with a probe light beam having a probe light wavelength. The visible light beam may have a visible light wavelength. The probe light wavelength may differ from the visible light wavelength. As an example, the visible light wavelength may be within a visible light spectrum, while the probe light wavelength may be within an infrared light spectrum.

When methods 200 include directing the visible light beam through the optical probe, methods 200 also may include selectively conveying only one of the probe light beam and the visible light beam through the optical probe at a given point in time. Stated another way, methods 200 may be configured such that the probe system selectively conveys one of the visible light beam and the probe light beam through the optical probe in the absence of the other of the visible light beam and the probe light beam being conveyed through the optical probe. Stated yet another way, methods 200 may not include simultaneously conveying both the visible light beam and the probe light beam through the optical probe.

In some examples of methods 200 that include directing the visible light beam through the optical probe, the optical probe may include and/or be a lensed optical fiber. In such examples, a lens of the lensed optical fiber may define the probe tip of the probe, and the directing the visible light beam may cause the lens to be an illuminated lens. Such an illuminated lens may permit and/or facilitate accurate determination of the location of the probe tip within the reference probe image.

In some examples, the probe reference structure may be operatively attached to the optical probe, defined by the optical probe, and/or defined within the optical probe. Such a probe reference structure may be designed, sized, shaped, positioned, and/or constructed to permit and/or facilitate accurate determination of the location of the probe reference structure within the reference probe image and/or during the determining at 230. An example of such a probe reference structure includes a microsphere that may be operatively attached to the optical probe, such as via an adhesive.

Determining the desired relative orientation at 230 may include determining the desired relative orientation between the optical probe and the DUT. The desired relative orientation may define a desired gap spacing between the optical probe and the optical device, may define a desired gap spacing between the probe tip of the optical probe and the optical device, and/or may define a desired relative orientation between the optical probe and the optical device and/or between the optical probe and the waveguide entrance to the optical device. As discussed in more detail herein, a current, actual, and/or existing relative orientation between the optical probe and the optical device, at a given point in time, may be compared to the desired relative orientation to permit and/or facilitate correction of the existing relative orientation to the desired relative orientation.

In some examples, the determining at 230 may include determining the desired relative orientation based, at least in part, on the reference DUT image and/or the reference probe image. In some such examples, such as when methods 200 include the aligning at 210, the reference DUT image may include and/or be an image that represents the desired relative orientation between the optical probe and the DUT. In some such examples, the determining at 230 may include measuring, quantifying, and/or establishing the desired relative orientation from the reference DUT image and/or from the reference probe image.

In some examples, the determining at 230 may include calculating the desired relative orientation between the optical probe and the DUT. In some examples, the desired relative orientation between the optical probe and the DUT may be based upon, or may be calculated based upon, at least one predetermined property of the optical device, at least one predetermined property of the optical probe, a location of a waveguide entrance to the optical device, a location of the DUT reference structure, a predetermined relative orientation between the waveguide entrance to the optical device and the DUT reference structure, the desired gap spacing, and/or a predetermined focal length of a lens of the optical probe.

In some examples, the determining at 230 may include determining the desired relative orientation in two dimensions, or only in the two dimensions. As an example, the determining at 230 may include determining the desired relative orientation within a plane. In such examples, the maintaining at 260 may include determining a probe-DUT offset, which is discussed in more detail herein, within the plane. The plane may be parallel, or at least substantially parallel, to a surface of the substrate and/or to an upper surface of the substrate. When the determining at 230 includes determining the desired relative orientation in two dimensions, the determining at 230 may be based, or may be based solely, upon the reference DUT image and the reference probe image.

In some examples, the determining at 230 may include determining the desired relative orientation in three dimensions. In such examples, the maintaining at 260 may include determining the probe-DUT offset in the three dimensions. As an example, the desired relative orientation may be determined in two dimensions from the reference DUT image and the reference probe image. In this example, the desired relative orientation may be determined in the third dimension via a separate distance sensor configured to measure a vertical position of the optical probe. Examples of the distance sensor are disclosed herein with reference to distance sensor 21 of FIG. 1.

As another example, the desired relative orientation may be determined in all three dimensions from the reference DUT image and the reference probe image. In this example, the collecting at 220 may include collecting separate reference images, such as the first reference image and the second reference image, of the DUT reference structure and the probe reference structure. In one of the first reference image and the second reference image, the DUT reference structure may be in focus to the optical imaging device. In the other of the first reference image and the second reference image, the probe reference structure may be in focus to the optical imaging device. This change in focus may be accomplished by moving the optical imaging device relative to the DUT and/or by moving the DUT relative to the optical imaging device. In such examples, the desired relative orientation may be determined in the third dimension based, at least in part, upon a focus height of the optical imaging device when collecting the separate reference images and/or upon a magnitude of motion of the DUT between the separate reference images.

As yet another example, the desired relative orientation may be determined in all three dimensions from the reference DUT image, the reference probe image, the separate distance sensor, and/or calibration information regarding the probe system. As an example, information from the separate distance sensor and/or the calibration information may be utilized to predict a relative orientation at which the probe reference structure and/or the DUT reference structure will be in focus to the optical imagining device, and the optical imaging device may be utilized to verify the predicted relative orientation.

Optically testing at 240 may include optically testing the optical device of the DUT with, via, and/or utilizing the optical probe. This may include providing an optical test signal to the optical device via the optical probe and/or receiving an optical resultant signal from the optical device via the optical probe.

Changing the temperature of the device under test (DUT) at 250 may include changing the temperature of the DUT in any suitable manner. As examples, the changing at 250 may include increasing the temperature of the DUT, decreasing the temperature of the DUT, ramping the temperature of the DUT between a first temperature and a second temperature, and/or performing a plurality of discrete, or stepped, temperature changes between the first temperature and the second temperature.

When methods 200 include the changing at 250, the methods further may include repeating the optically testing at 240 a plurality of times during the changing at 250. Stated another way, the optically testing at 240 and the changing at 250 may be performed at least partially concurrently and/or such that the optically testing at 240 includes optically testing at a plurality of temperatures, or at a plurality of different temperatures.

When methods 200 include the changing at 250, the methods 200 further may include performing the maintaining at 260 during the changing at 250 and/or during the repeating the optically testing that is performed during the changing at 250. Stated another way, methods 200 may utilize the maintaining at 260 to maintain the gap spacing between the optical probe and the optical device during the changing at 250. Such a configuration may increase an accuracy of test results obtained via the optically testing at 240 and during the changing at 250.

Maintaining the desired relative orientation at 260 may include maintaining the desired relative orientation between the optical probe and the DUT in any suitable manner. As an example, the maintaining at 260 may include repeatedly and sequentially collecting, with the optical imaging device, an existing DUT image of the DUT reference structure and an existing probe image of the probe reference structure. This may be performed in a manner that may be similar, or at least substantially similar, to the collecting at 220, which is discussed in more detail herein. The existing DUT image also may be referred to herein as a subsequent DUT image. Similarly, the exiting probe image also may be referred to herein as a subsequent probe image.

The maintaining at 260 then may include determining, based, at least in part, on the desired relative orientation, the existing DUT image, and the existing probe image, the probe-DUT offset between an existing relative orientation between the optical probe and the DUT and the desired relative orientation. This may be at least substantially similar to the determining at 230, which is discussed in more detail herein, with the probe-DUT offset being defined as a difference between the existing relative orientation and the desired relative orientation.

The maintaining at 260 then may include adjusting the existing relative orientation to return the optical probe and the DUT to the desired relative orientation and/or may include adjusting based, at least in part, on the probe-DUT offset. The maintaining at 260 may include maintaining the desired relative orientation between the optical probe and the DUT to within a threshold orientation change, which may be measured in two or three dimensions. Examples of the threshold orientation change include threshold orientation changes of less than 1 millimeter, less than 500 micrometers, less than 400 micrometers, less than 300 micrometers, less than 200 micrometers, less than 100 micrometers, less than 50 micrometers, less than 40 micrometers, less than 30 micrometers, less than 20 micrometers, less than 10 micrometers, less than 5 micrometers, less than 4 micrometers, less than 3 micrometers, less than 2 micrometers, less than 1 micrometer, less than 0.5 micrometers, less than 0.25 micrometers, at least 25 micrometers, at least 50 micrometers, at least 100 micrometers, at least 150 micrometers, and/or at least 250 micrometers.

In some examples, the maintaining at 260 may include automatically maintaining the desired relative orientation, such as without, without the use of, and/or in the absence of human intervention and/or human adjustment. As examples, the maintaining at 260 may be performed utilizing a controller of the probe system and/or utilizing an electrically actuated positioning assembly of the probe system.

In the present disclosure, several of the illustrative, non-exclusive examples have been discussed and/or presented in the context of flow diagrams, or flow charts, in which the methods are shown and described as a series of blocks, or steps. Unless specifically set forth in the accompanying description, it is within the scope of the present disclosure that the order of the blocks may vary from the illustrated order in the flow diagram, including with two or more of the blocks (or steps) occurring in a different order and/or concurrently. It is also within the scope of the present disclosure that the blocks, or steps, may be implemented as logic, which also may be described as implementing the blocks, or steps, as logics. In some applications, the blocks, or steps, may represent expressions and/or actions to be performed by functionally equivalent circuits or other logic devices. The illustrated blocks may, but are not required to, represent executable instructions that cause a computer, processor, and/or other logic device to respond, to perform an action, to change states, to generate an output or display, and/or to make decisions.

As used herein, the term "and/or" placed between a first entity and a second entity means one of (1) the first entity, (2) the second entity, and (3) the first entity and the second entity. Multiple entities listed with "and/or" should be construed in the same manner, i.e., "one or more" of the entities so conjoined. Other entities may optionally be present other than the entities specifically identified by the "and/or" clause, whether related or unrelated to those entities specifically identified. Thus, as a non-limiting example, a reference to "A and/or B," when used in conjunction with open-ended language such as "comprising" may refer, in one embodiment, to A only (optionally including entities other than B); in another embodiment, to B only (optionally including entities other than A); in yet another embodiment, to both A and B (optionally including other entities). These entities may refer to elements, actions, structures, steps, operations, values, and the like.

As used herein, the phrase "at least one," in reference to a list of one or more entities should be understood to mean at least one entity selected from any one or more of the entities in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C," and "A, B, and/or C" may mean A alone, B alone, C alone, A and B together, A and C together, B and C together, A, B, and C together, and optionally any of the above in combination with at least one other entity.

In the event that any patents, patent applications, or other references are incorporated by reference herein and (1) define a term in a manner that is inconsistent with and/or (2) are otherwise inconsistent with, either the non-incorporated portion of the present disclosure or any of the other incorporated references, the non-incorporated portion of the present disclosure shall control, and the term or incorporated disclosure therein shall only control with respect to the reference in which the term is defined and/or the incorporated disclosure was present originally.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

As used herein, "at least substantially," when modifying a degree or relationship, may include not only the recited "substantial" degree or relationship, but also the full extent of the recited degree or relationship. A substantial amount of a recited degree or relationship may include at least 75% of the recited degree or relationship. For example, an object that is at least substantially formed from a material includes objects for which at least 75% of the objects are formed from the material and also includes objects that are completely formed from the material. As another example, a first length that is at least substantially as long as a second length includes first lengths that are within 75% of the second length and also includes first lengths that are as long as the second length.

Illustrative, non-exclusive examples of systems and methods according to the present disclosure are presented in the following enumerated paragraphs. It is within the scope of the present disclosure that an individual step of a method recited herein, including in the following enumerated paragraphs, may additionally or alternatively be referred to as a "step for" performing the recited action.

A1. A method of maintaining gap spacing between an optical probe of a probe system and an optical device of a device under test (DUT) that is positioned on a substrate, the method comprising:

optionally collecting, with an optical imaging device of the probe system, a reference DUT image of a DUT reference structure of the DUT and a reference probe image of a probe reference structure of the optical probe;

determining a desired relative orientation between the optical probe and the DUT, optionally wherein the determining the desired relative orientation is based, at least in part, on the reference DUT image and the reference probe image, wherein the desired relative orientation defines a desired gap spacing between the optical probe and the optical device;

optically testing the optical device with the optical probe; and during the optically testing, maintaining the desired relative orientation by repeatedly and sequentially:
  (i) collecting, with the optical imaging device, an existing DUT image of the DUT reference structure and an existing probe image of the probe reference structure;
  (ii) determining, based, at least in part, on the desired relative orientation, the existing DUT image, and the existing probe image, a probe-DUT offset between an existing relative orientation between the optical probe and the DUT and the desired relative orientation; and
  (iii) adjusting, based, at least in part, on the probe-DUT offset, the existing relative orientation to return the optical probe and the DUT to the desired relative orientation.

A2. The method of paragraph A1, wherein at least one of the collecting the reference DUT image and the reference probe image and the collecting the existing DUT image and the existing probe image include at least one of:
  (i) collecting along an optical path that extends perpendicular, or at least substantially perpendicular, to a substrate surface of the substrate; and
  (ii) collecting from above the substrate.

A3. The method of any of paragraphs A1-A2, wherein at least one of the collecting the reference DUT image and the reference probe image and the collecting the existing DUT image and the existing probe image include collecting such that at least one of:

(i) the gap spacing between the optical probe and the optical device is visible within the reference DUT image and the existing DUT image; and (ii) the gap spacing between the optical probe and the optical device is visible within the reference probe image and the existing probe image.

A4. The method of any of paragraphs A1-A3, wherein at least one of:

(i) the collecting the reference DUT image and the reference probe image includes collecting a single reference image that includes both the DUT reference structure and the probe reference structure; and (ii) the collecting the existing DUT image and the existing probe image includes collecting a single existing image that includes both the DUT reference structure and the probe reference structure.

A5. The method of any of paragraphs A1-A4, wherein at least one of:

(i) the collecting the reference DUT image and the reference probe image includes collecting a first reference image that includes the reference DUT image and collecting a second reference image that includes the reference probe image; and (ii) the collecting the existing DUT image and the existing probe image includes collecting a first existing image that includes the existing DUT image and collecting a second existing image that includes the existing probe image.

A6. The method of any of paragraphs A1-A5, wherein the DUT reference structure is defined by the substrate.

A7. The method of any of paragraphs A1-A6, wherein the DUT reference structure and the probe reference structure are visible within a single field of view of the optical imaging device.

A8. The method of any of paragraphs A1-A7, wherein the DUT reference structure has a fixed orientation with respect to the optical device.

A9. The method of any of paragraphs A1-A8, wherein the probe reference structure is at least one of:

(i) defined by the optical probe;

(ii) operatively attached to the optical probe; and (iii) emitted from the optical probe.

A10. The method of any of paragraphs A1-A9, wherein the probe reference structure includes, or is, a shape of at least a region of the optical probe.

A11. The method of paragraph A10, wherein the at least a region of the optical probe includes a probe tip of the optical probe.

A12. The method of any of paragraphs A1-A11, wherein the method further includes directing a visible light beam through the optical probe to a/the probe tip of the optical probe to illuminate the probe tip and generate an illuminated probe tip, and further wherein the probe reference structure includes the illuminated probe tip.

A13. The method of paragraph A12, wherein the optically testing includes optically testing with a probe light beam having a probe light wavelength that differs from a visible light wavelength of the visible light beam.

A14. The method of paragraph A13, wherein the visible light wavelength is within a visible light spectrum.

A15. The method of any of paragraphs A13-A14, wherein the probe light wavelength is within an infrared light spectrum.

A16. The method of any of paragraphs A13-A15, wherein the method further includes selectively conveying only one of the probe light beam and the visible light beam through the optical probe at a given point in time.

A17. The method of any of paragraphs A1-A16, wherein the optical probe includes a lensed optical fiber, and further wherein a lens of the lensed optical fiber defines a/the probe tip of the optical probe.

A18. The method of any of paragraphs A1-A17, wherein the probe reference structure is at least one of operatively attached to the optical probe, defined on the optical probe, and defined within the optical probe.

A19. The method of any of paragraphs A1-A18, wherein the probe reference structure includes a microsphere that is operatively attached to the optical probe.

A20. The method of any of paragraphs A1-A19, wherein at least one of:

(i) the determining the desired relative orientation includes determining the desired relative orientation within a plane; and (ii) the determining the probe-DUT offset includes determining the probe-DUT offset within the plane.

A21. The method of paragraph A20, wherein the plane is at least substantially parallel to a/the surface of the substrate.

A22. The method of any of paragraphs A1-A21, wherein at least one of:

(i) the determining the desired relative orientation includes determining the desired relative orientation in three dimensions; and (ii) the determining the probe-DUT offset includes determining the probe-DUT offset in three dimensions.

A23. The method of any of paragraphs A1-A22, wherein the maintaining includes maintaining the desired relative orientation between the optical probe and the DUT to within a threshold orientation change, optionally in two dimensions, and further optionally in three dimensions.

A24. The method of paragraph A23, wherein the threshold orientation change is less than 1 millimeter, less than 500 micrometers, less than 400 micrometers, less than 300 micrometers, less than 200 micrometers, less than 100 micrometers, less than 50 micrometers, less than 40 micrometers, less than 30 micrometers, less than 20 micrometers, less than 10 micrometers, less than 5 micrometers, less than 4 micrometers, less than 3 micrometers, less than 2 micrometers, less than 1 micrometer, less than 0.5 micrometers, or less than 0.25 micrometers.

A25. The method of any of paragraphs A1-A24, wherein the maintaining includes automatically maintaining the desired relative orientation between the optical probe and the DUT.

A26. The method of paragraph A25, wherein the automatically maintaining includes utilizing at least one of:

(i) a controller of the probe system; and (ii) an electrically actuated positioning assembly of the probe system.

A27. The method of any of paragraphs A1-A26, wherein the optically testing includes at least one of:

(i) providing an optical test signal to the optical device via the optical probe; and (ii) receiving an optical resultant signal from the optical device via the optical probe.

A28. The method of any of paragraphs A1-A27, wherein, prior to at least one of the collecting the reference DUT image of the DUT reference structure and the reference probe image of the probe reference structure, the method further includes aligning the optical probe with the optical device.

A29. The method of paragraph A28, wherein the aligning the optical probe with the optical device includes establishing the gap spacing between the optical probe and the optical device.

A30. The method of any of paragraphs A28-A29, wherein the aligning the optical probe with the optical device includes positioning the optical probe proximate a vertical surface of the substrate that includes the optical device.

A31. The method of any of paragraphs A1-A30, wherein, during the optically testing, the method further includes changing a temperature of the DUT, wherein the method includes repeating the optically testing a plurality of times during the changing the temperature of the DUT to optically test the optical device at a plurality of temperatures, and further wherein the method includes performing the maintaining during the changing and also during the repeating the optically testing.

A32. The method of any of paragraphs A1-A31, wherein the determining the desired relative orientation between the optical probe and the DUT includes calculating the desired relative orientation between the optical probe and the DUT.

A33. The method of any of paragraphs A1-A32, wherein the determining the desired relative orientation between the optical probe and the DUT is based, at least in part, on at least one of:
(i) at least one predetermined property of the optical device;
(ii) at least one predetermined property of the optical probe;
(iii) a location of a waveguide entrance to the optical device;
(iv) a location of a/the DUT reference structure;
(v) a predetermined relative orientation between the waveguide entrance to the optical device and the DUT reference structure;
(vi) the desired gap spacing; and
(vii) a predetermined focal length of a lens of the optical probe.

B1. A probe system, comprising:
a probing assembly including an optical probe that defines a probe tip;
a support surface configured to support a substrate that includes a device under test (DUT) that includes an optical device;
an electrically actuated positioning assembly configured to selectively adjust a relative orientation between the optical probe and the DUT;
an optical imaging device; and
a controller programmed to control the operation of the probe system according to the method of any of paragraphs A1-A33.

C1. Non-transitory computer-readable storage media including computer-readable instructions that, when executed, direct a probe system to perform the method of any of paragraphs A1-A33.

INDUSTRIAL APPLICABILITY

The systems and methods disclosed herein are applicable to the optical device manufacturing and test industries.

It is believed that the disclosure set forth above encompasses multiple distinct inventions with independent utility. While each of these inventions has been disclosed in its preferred form, the specific embodiments thereof as disclosed and illustrated herein are not to be considered in a limiting sense as numerous variations are possible. The subject matter of the inventions includes all novel and non-obvious combinations and subcombinations of the various elements, features, functions and/or properties disclosed herein. Similarly, where the claims recite "a" or "a first" element or the equivalent thereof, such claims should be understood to include incorporation of one or more such elements, neither requiring nor excluding two or more such elements.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower, or equal in scope to the original claims, are also regarded as included within the subject matter of the inventions of the present disclosure.

The invention claimed is:

1. A method of maintaining gap spacing between an optical probe of a probe system and an optical device of a device under test (DUT) that is positioned on a substrate, the method comprising:
determining a desired relative orientation between the optical probe and the DUT, wherein the desired relative orientation defines a desired gap spacing between the optical probe and the optical device;
optically testing the optical device with the optical probe; and
during the optically testing, maintaining the desired relative orientation by repeatedly and sequentially:
(i) collecting, with an optical imaging device of the probe system, an existing DUT image of a DUT reference structure of the DUT and an existing probe image of a probe reference structure of the optical probe;
(ii) determining, based, at least in part, on the desired relative orientation, the existing DUT image, and the existing probe image, a probe-DUT offset between an existing relative orientation between the optical probe and the DUT and the desired relative orientation; and
(iii) adjusting, based, at least in part, on the probe-DUT offset, the existing relative orientation to return the optical probe and the DUT to the desired relative orientation.

2. The method of claim 1, wherein the determining the desired relative orientation between the optical probe and the DUT includes calculating the desired relative orientation between the optical probe and the DUT.

3. The method of claim 1, wherein the determining the desired relative orientation between the optical probe and the DUT is based, at least in part, on at least one of:
(i) at least one predetermined property of the optical device;
(ii) at least one predetermined property of the optical probe;
(iii) a location of a waveguide entrance to the optical device;
(iv) a location of the DUT reference structure;
(v) a predetermined relative orientation between the waveguide entrance to the optical device and the DUT reference structure;
(vi) the desired gap spacing; and
(vii) a predetermined focal length of a lens of the optical probe.

4. The method of claim 1, wherein the method further includes collecting, with the optical imaging device, a reference DUT image of the DUT reference structure and a reference probe image of the probe reference structure, wherein the determining the desired relative orientation is based, at least in part, on the reference DUT image and the reference probe image.

5. The method of claim 4, wherein, prior to at least one of the collecting the reference DUT image of the DUT reference structure and the reference probe image of the probe reference structure, the method further includes aligning the optical probe with the optical device.

6. The method of claim 5, wherein the aligning the optical probe with the optical device includes establishing the desired gap spacing between the optical probe and the optical device.

7. The method of claim 5, wherein the aligning the optical probe with the optical device includes positioning the optical probe proximate a vertical surface of the substrate that includes the optical device.

8. The method of claim 1, wherein the collecting the existing DUT image and the existing probe image includes at least one of:
(i) collecting along an optical path that extends at least substantially perpendicular to a substrate surface of the substrate; and
(ii) collecting from above the substrate.

9. The method of claim 1, wherein the collecting the existing DUT image and the existing probe image includes collecting such that the gap spacing between the optical probe and the optical device is visible within the reference probe image and the existing probe image.

10. The method of claim 1, wherein the collecting the existing DUT image and the existing probe image includes collecting a single existing image that includes both the DUT reference structure and the probe reference structure.

11. The method of claim 1, wherein the collecting the existing DUT image and the existing probe image includes collecting a first existing image that includes the existing DUT image and collecting a second existing image that includes the existing probe image.

12. The method of claim 1, wherein the method further includes directing a visible light beam through the optical probe to a probe tip of the optical probe to illuminate the probe tip and generate an illuminated probe tip, and further wherein the probe reference structure includes the illuminated probe tip.

13. The method of claim 12, wherein the optically testing includes optically testing with a probe light beam having a probe light wavelength that differs from a visible light wavelength of the visible light beam, and further wherein the method includes selectively conveying only one of the probe light beam and the visible light beam through the optical probe at a given point in time.

14. The method of claim 1, wherein at least one of:
(i) the determining the desired relative orientation includes determining the desired relative orientation within a plane; and
(ii) the determining the probe-DUT offset includes determining the probe-DUT offset within the plane.

15. The method of claim 1, wherein at least one of:
(i) the determining the desired relative orientation includes determining the desired relative orientation in three dimensions; and
(ii) the determining the probe-DUT offset includes determining the probe-DUT offset in three dimensions.

16. The method of claim 1, wherein the maintaining includes maintaining the desired relative orientation between the optical probe and the DUT to within a threshold orientation change of less than 200 micrometers.

17. The method of claim 1, wherein the maintaining includes automatically maintaining the desired relative orientation between the optical probe and the DUT, wherein the automatically maintaining includes utilizing at least one of:
(i) a controller of the probe system; and
(ii) an electrically actuated positioning assembly of the probe system.

18. The method of claim 1, wherein, during the optically testing, the method further includes changing a temperature of the DUT, wherein the method includes repeating the optically testing a plurality of times during the changing the temperature of the DUT to optically test the optical device at a plurality of temperatures, and further wherein the method includes performing the maintaining during the changing and also during the repeating the optically testing.

19. A probe system, comprising:
a probing assembly including an optical probe that defines a probe tip;
a support surface configured to support a substrate that includes a device under test (DUT) that includes an optical device;
an electrically actuated positioning assembly configured to selectively adjust a relative orientation between the optical probe and the DUT;
an optical imaging device; and
a controller programmed to control the operation of the probe system according to the method of claim 1.

20. Non-transitory computer-readable storage media including computer-readable instructions that, when executed, direct a probe system to perform the method of claim 1.

* * * * *